United States Patent
Miyata

(10) Patent No.: US 11,581,229 B2
(45) Date of Patent: Feb. 14, 2023

(54) POWER SEMICONDUCTOR MODULE WITH ADHESIVE FILLED TAPERED PORTION

(71) Applicant: Mitsubishi Electric Corporation, Tokyo (JP)

(72) Inventor: Toshihiko Miyata, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 17/157,650

(22) Filed: Jan. 25, 2021

(65) Prior Publication Data

US 2021/0305107 A1    Sep. 30, 2021

(30) Foreign Application Priority Data

Mar. 26, 2020 (JP) ............................. JP2020-056269

(51) Int. Cl.
*H01L 23/053* (2006.01)
*H01L 23/14* (2006.01)
(Continued)

(52) U.S. Cl.
CPC .......... *H01L 23/053* (2013.01); *H01L 23/145* (2013.01); *H01L 23/3121* (2013.01);
(Continued)

(58) Field of Classification Search
CPC . H01L 23/3121; H01L 23/053; H01L 23/145; H01L 23/04; H01L 23/36; H01L 2224/48227; H01L 2924/181; H01L 2224/45147; H01L 2224/45014; H01L 2224/73265; H01L 2224/48091;
(Continued)

(56) References Cited

U.S. PATENT DOCUMENTS

2017/0141022 A1* 5/2017 Maruyama .......... H01L 23/3142
2019/0164858 A1   5/2019 Koyanagi
(Continued)

FOREIGN PATENT DOCUMENTS

DE   102019202038 A1 * 10/2019 ............. H01L 21/52
JP       6399272 B2 * 10/2018 ........... H05K 1/0271
(Continued)

OTHER PUBLICATIONS

An Office Action issued by the German Patent and Trade Mark Office dated Oct. 27, 2022, which corresponds to German Patent Application No. 102021105479.6 and is related to U.S. Appl. No. 17/157,650; with English language translation.

*Primary Examiner* — Alexander O Williams
(74) *Attorney, Agent, or Firm* — Studebaker & Brackett PC

(57) ABSTRACT

Provided is a power semiconductor module that can secure insulating properties. A semiconductor element is mounted on a resin-insulated base plate including a circuit pattern, a resin insulating layer, and a base plate. A case enclosing the resin-insulated base plate is bonded to the resin insulating layer with an adhesive. The resin insulating layer and the case are bonded together with a region enclosed by the resin insulating layer and a tapered portion of the case formed closer to the resin insulating layer being filled with the adhesive made of a material identical to that of the sealing resin. Air bubbles in the adhesive appear in the tapered portion opposite to the resin insulating layer.

5 Claims, 2 Drawing Sheets

(51) Int. Cl.
*H01L 23/31* (2006.01)
*H01L 23/00* (2006.01)

(52) U.S. Cl.
CPC .............. *H01L 24/48* (2013.01); *H01L 24/73* (2013.01); *H01L 2224/48091* (2013.01); *H01L 2224/48227* (2013.01); *H01L 2224/73265* (2013.01)

(58) Field of Classification Search
CPC ......... H01L 24/48; H01L 2224/830801; H01L 24/32; H01L 2924/19107; H01L 2224/83424; H01L 2224/45124; H01L 2224/45015; H01L 23/142; H01L 2924/173; H01L 24/73; H01L 24/45; H01L 2224/83447; H01L 2224/32225; H01L 2224/8384; H01L 23/24; H01L 2224/4846; H01L 24/29; H01L 2224/29111; H01L 2924/1715; H01L 2924/00014; H01L 2924/2076; H01L 2924/00012; H01L 2224/83801; H01L 224/29111; H01L 224/73265; H01L 224/48227
USPC ........................................................ 257/668
See application file for complete search history.

(56) References Cited

U.S. PATENT DOCUMENTS

2019/0393184 A1* 12/2019 Kondo .................... H01L 23/24
2020/0205292 A1* 6/2020 Inoue ...................... H01L 23/24

FOREIGN PATENT DOCUMENTS

JP         2019-096797 A     6/2019
WO     2019049400 A1 *   3/2019 ........... H01L 25/072

* cited by examiner

POWER SEMICONDUCTOR MODULE WITH ADHESIVE FILLED TAPERED PORTION

FIELD OF THE INVENTION

The present disclosure relates to a power semiconductor module.

DESCRIPTION OF THE BACKGROUND ART

In conventional semiconductor devices, a base plate is fixed to a case with a thick adhesive fillet between the case and the upper surface of the base plate (for example, see paragraphs 0013 to 0016 and FIGS. 1 and 2 of Japanese Patent Application Laid-Open No. 2019-96797).

However, when an adhesive with high viscosity such as a sealing resin with which the case is filled is used, fluidity of the adhesive decreases, and air bubbles are easily generated. Thus, insulation on the insulating substrate is sometimes insufficient.

SUMMARY

Provided is a power semiconductor module that can secure insulating properties.

The power semiconductor module according to this disclosure includes: a resin-insulated base plate on which a semiconductor element is mounted; a case enclosing the resin-insulated base plate; a sealing resin with which a region enclosed by the resin-insulated base plate and the case is sealed; and an adhesive with which the resin-insulated base plate is bonded to the case, the adhesive filling a tapered portion enclosed by the resin-insulated base plate and the case and formed on the case closer to the resin-insulated base plate.

The insulating properties of the power semiconductor module can be secured.

These and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1:
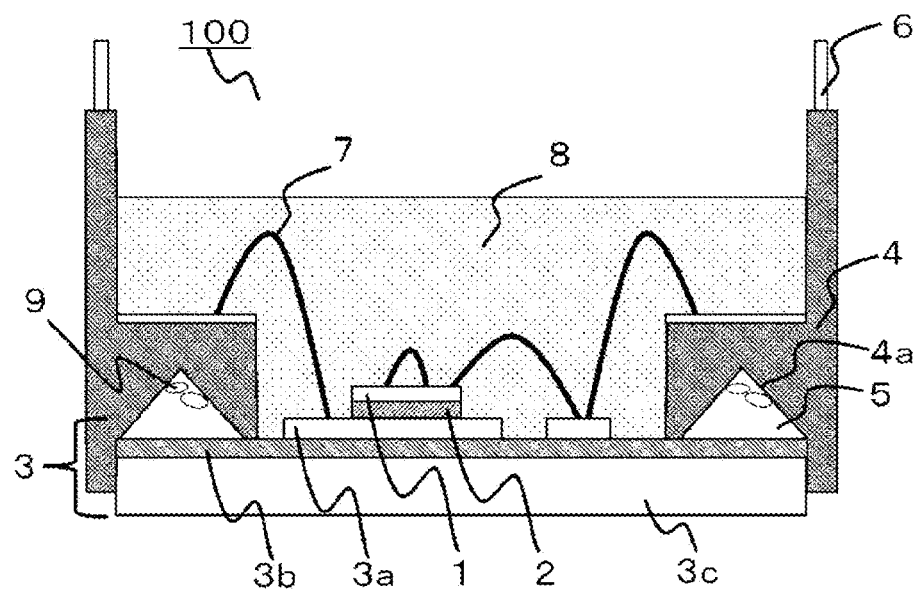
FIG. 1 is a cross-sectional view illustrating a structure of a power semiconductor module according to Embodiment 1.

A structure of a power semiconductor module according to Embodiment 1 will be described with reference to the drawings. FIG. 1 is a cross-sectional view illustrating the structure of the power semiconductor module.

Power semiconductor modules are widely used, for example, for inverter devices, processing units, and industries such as industrial robots. As illustrated in FIG. 1, the power semiconductor module 100 includes a semiconductor element 1, a resin-insulated base plate 3, a case 4, electrode terminals 6, a metal wire 7, and a sealing resin 8. The resin-insulated base plate 3 and the case 4 are bonded and fixed with an adhesive 5 between the case 4 and a resin insulating layer 3b of the resin-insulated base plate 3.

The number of the semiconductor elements 1 mounted on the resin-insulated base plate 3 is at least one. The necessary number of the semiconductor elements 1 can be mounted according to the specification of the power semiconductor module 100.

The semiconductor element 1 is made of Si, and is generally called a power semiconductor device that controls power. The semiconductor element 1 is, for example, an insulated gate bipolar transistor (IGBT), a metal oxide semiconductor field effect transistor (MOSFET), or a freewheeling diode (FWD). One side of the semiconductor element 1 is 3 to 15 mm long. The semiconductor element 1 is not limited to the one made of Si, but may be a wide bandgap semiconductor element made of SiC or GaN.

Furthermore, the semiconductor element 1 is mounted on a circuit pattern 3a of the resin-insulated base plate 3 through a bonding material 2. The bonding material 2 is a conductive metal containing Sn, and is generally called a solder. Since the semiconductor element 1 generates heat, the bonding material 2 is not limited to the solder but may be a sintered material higher in thermal conductivity than the solder and with high heat dissipation.

The resin-insulated base plate 3 is a stack of the circuit pattern 3a, the resin insulating layer 3b, and a base plate 3c. The circuit pattern 3a is made of a conductive metal containing Cu or Al, and is, for example, approximately 0.5 mm thick. The thickness of the circuit pattern 3a is set by a current density or an exotherm temperature when an electric current is applied. The resin insulating layer 3b is made of an epoxy resin containing fillers made of BN or $Al_2O_3$, and is 0.1 to 0.2 mm thick. The base plate 3c is made of a metal superior in thermal conductivity and containing Cu or Al, and is 1 to 5 mm thick. The thermal conductivity of the resin-insulated base plate 3 is 6 to 18 W/(m·K), and separately used according to the specification on heat dissipation necessary for the power semiconductor module 100.

The case 4 contains a polyphenylene sulfide (PPS) resin or a polybutylene terephthalate (PBT) resin.

The electrode terminals 6 are insert-molded with the case 4, and embedded in the case 4. As illustrated in FIG. 1, the electrode terminals 6 are bent. One end of each of the electrode terminals 6 protrudes and extends from the case 4 for external electrical input and output. The other end of each of the electrode terminals 6 is exposed on the flat surface inside the case 4.

As illustrated in FIG. 1, the semiconductor element 1, the circuit pattern 3a, and the electrode terminals 6 are electrically connected to each other through the metal wire 7. The metal wire 7 is made of Al or Cu. The metal wire 7 is 0.1 to 0.5 mm in diameter. The electrical connection may be made through a plate-shaped ribbon wire that can support a large current, without being limited by the metal wire 7 with the linear shape.

A region enclosed by the case 4 and a surface on which the semiconductor element 1 on the resin-insulated base plate 3 is mounted is filled and sealed with the sealing resin 8. The sealing resin 8 is a thermosetting resin, and is an epoxy resin containing fillers made of $SiO_2$. However, the sealing resin 8 is not limited to this, but may be any resin with necessary bending modulus of elasticity, thermal conductivity, heat resistance, insulating properties, and adherence. Except the epoxy resin, the sealing resin 8 may be, for example, a silicone resin, a phenolic resin, or a polyimide resin.

The resin insulating layer 3b and the case 4 are bonded and fixed with the adhesive 5. This can prevent the sealing resin 8 from leaking out when the region enclosed by the case 4 is filled with the sealing resin 8. The adhesive 5 is made of a material identical to that of the sealing resin 8.

As illustrated in FIG. 1, a tapered portion 4a is formed on the case 4 closer to the resin-insulated base plate 3. The resin insulating layer 3b and the case 4 are bonded together with the region enclosed by the resin insulating layer 3b and the case 4 being filled with the adhesive 5. Air entrainment when the region is filled with the adhesive 5 may generate air bubbles 9. After the region is filled with the adhesive 5, when the adhesive 5 is heated to be cured, generation of the air bubbles 9 or collection of the invisible and minute air bubbles 9 that are scattered in the adhesive 5 may cause the air bubbles 9 to increase in size that affects the insulating properties. Particularly, the adhesive 5 is made of the material identical to that of the sealing resin 8, and its viscosity is as high as 20 to 60 Pa'S. Thus, when a narrow region between the resin insulating layer 3b and the case 4 is filled with the adhesive 5, fluidity of the adhesive 5 decreases, and the air bubbles 9 are easily generated. The region that is filled with the sealing resin 8 is so large and the upper portion in the paper of FIG. 1 is so open that the air bubbles 9 hardly remain.

Contact of the air bubbles 9 with the resin insulating layer 3b causes a shortage of a creepage distance and insulation between the circuit pattern 3a and the base plate 3c. To prevent this, the tapered portion 4a that is tapered toward the top in the paper of FIG. 1 is formed on the lower surface (the lower portion in the paper of FIG. 1) of the case 4 that is bonded with the adhesive 5. The tapered portion 4a is filled with the adhesive 5 so that the air bubbles 9 appear distant from the resin insulating layer 3b as much as possible. Since the generated air bubbles 9 tend to move upward in the adhesive 5 in the paper of FIG. 1, the air bubbles 9 in the adhesive 5 can float and remain in the tapered portion 4a that is tapered toward the top in the paper of FIG. 1. The tapered portion 4a is 0.5 to 2 mm high with respect to the resin insulating layer 3b. The maximum dimension of the air bubbles 9 is approximately 0.1 mm.

As such, forming the tapered portion 4a on the case 4 and bonding the case 4 to the resin insulating layer 3b with the adhesive 5 can avoid the air bubbles 9 in the adhesive 5 from coming in contact with the resin insulating layer 3b. Thus, the insulating properties of the power semiconductor module 100 can be secured without a shortage of the creepage distance between the circuit pattern 3a and the base plate 3c.

In Embodiment 1, the semiconductor element 1 is mounted on the resin-insulated base plate 3 including the circuit pattern 3a, the resin insulating layer 3b, and the base plate 3c. The case 4 enclosing the resin-insulated base plate 3 is bonded to the resin insulating layer 3b with the adhesive 5. The region enclosed by the case 4 and the resin-insulated base plate 3 is sealed with the sealing resin 8. The resin insulating layer 3b and the case 4 are bonded together with the region enclosed by the resin insulating layer 3b and the tapered portion 4a of the case 4 formed closer to the resin insulating layer 3b being filled with the adhesive 5 made of the material identical to that of the sealing resin 8. The air bubbles 9 in the adhesive 5 appear in the tapered portion 4a opposite to the resin insulating layer 3b without contact with the resin insulating layer 3b. Thus, the insulating properties of the power semiconductor module 100 with such a structure can be secured without a shortage of the creepage distance between the circuit pattern 3a and the base plate 3c.

Forming not a rectangular solid but the tapered portion 4a on the case 4 can reduce the loading of the adhesive 5.

Since the resin insulating layer 3b comes in contact with the case 4, the adhesive 5 is hermetically sealed and closed. The structure is not limited to this, but a clearance such that the adhesive 5 will not seep may be created between the case 4 and the surface of the resin insulating layer 3b that is closer to the circuit pattern 3a. The clearance is preferably 0.2 mm or less in consideration of the dimension of the fillers.

Ni may be plated on the surface on which the circuit pattern 3a or the base plate 3c is exposed to enhance the outward appearances, improve solderability, and store and maintain the resin-insulated base plate 3.

Although not illustrated, a lid may be placed above the sealing resin 8 (the upper portion in the paper of FIG. 1).

Figure 2:
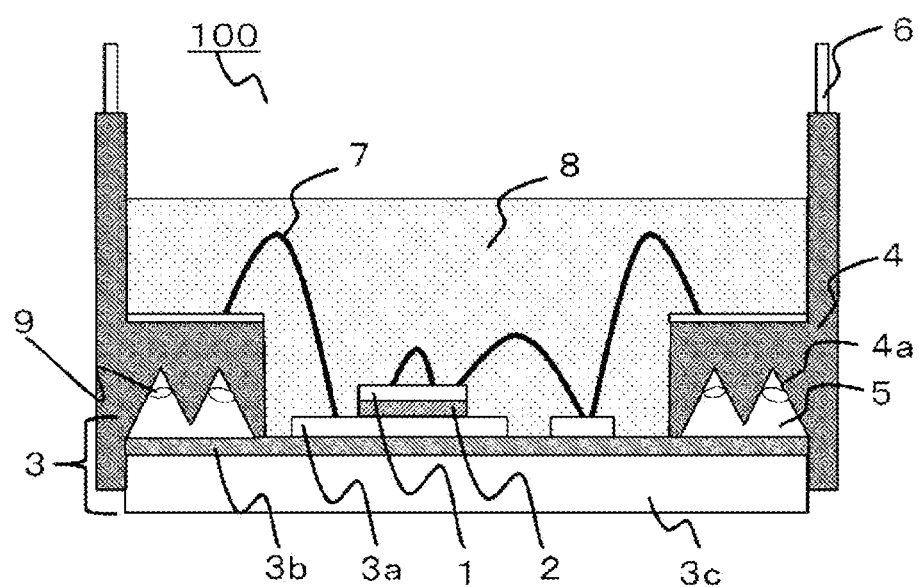
FIG. 2 illustrates a modification of the power semiconductor module according to Embodiment 1.

FIG. 2 illustrates a modification of the power semiconductor module 100. The case 4 includes two tapered portions 4a with a continuous chevron shape closer to the resin insulating layer 3b. The case 4 and the resin insulating layer 3b are bonded and fixed with a region enclosed by the tapered portions 4a of the case 4 and the resin insulating layer 3b being filled with the adhesive 5. This allows the air bubbles 9 in the adhesive 5 to be dispersed toward the tapered portions 4a without contact with the resin insulating layer 3b. This advantage is significant when the number of the air bubbles 9 is many. Thus, the insulating properties of the power semiconductor module 100 can be secured without a shortage of the creepage distance between the circuit pattern 3a and the base plate 3c. Furthermore, the adhesion strength between the adhesive 5 and the case 4 can be improved by the anchor effect.

The shapes of the tapered portions 4a formed on the case 4 are not limited to those illustrated in FIGS. 1 and 2 but may be any tapered shapes, which can produce the same advantages.

Embodiment 2

Figure 3:
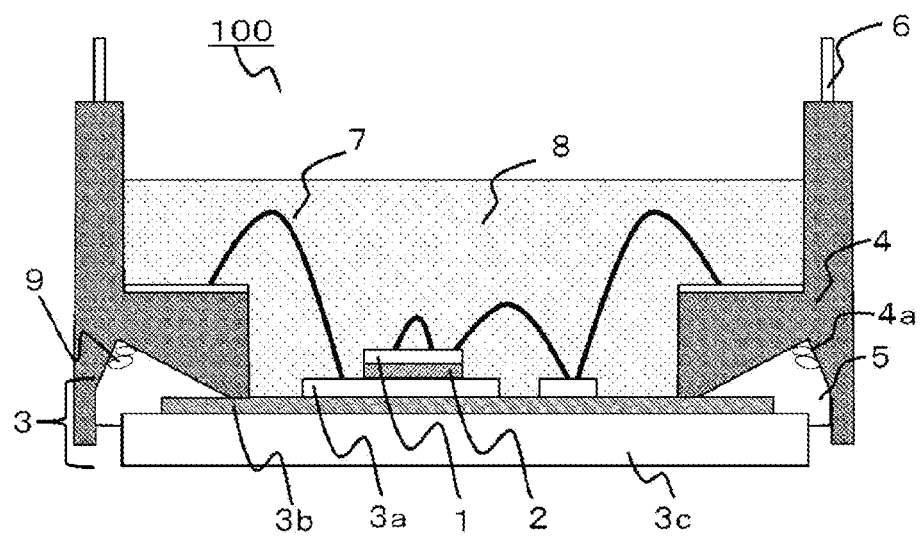
FIG. 3 is a cross-sectional view illustrating a structure of a power semiconductor module according to Embodiment 2.

FIG. 3 is a cross-sectional view illustrating a structure of a power semiconductor module according to Embodiment 2. The power semiconductor module 100 according to Embodiment 2 shares many components in common with that according to Embodiment 1. Thus, differences with Embodiment 1 will be described, the same reference numerals are attached to the same or corresponding components, and the description thereof is omitted. As illustrated in FIG. 3, Embodiment 2 differs from Embodiment 1 in a structure where the outer circumferential surface of the base plate 3c is exposed and a bonding structure of the resin-insulated base plate 3 and the case 4.

As illustrated in FIG. 3, the outer circumferential surface of the base plate 3c closer to a side on which the semiconductor element 1 is mounted is exposed without the resin insulating layer 3b. The resin insulating layer 3b is long enough to satisfy the creepage distance between the circuit pattern 3a and the base plate 3c.

The tapered portion 4a is formed on the case 4 closer to the resin-insulated base plate 3. The base plate 3c, the resin insulating layer 3b, and the case 4 are bonded together with a region enclosed by the resin insulating layer 3b, the base plate 3c, and the case 4 being filled with the adhesive 5.

A clearance is created between the case 4 and the side surface around the perimeter of the base plate 3c and the adhesive 5 is exposed, so that the air bubbles 9 in the adhesive 5 are easily emitted from the adhesive 5 during the adhesion or when the adhesive 5 is thermally cured. The adhesive 5 never seeps toward the surface of the base plate 3*c* opposite to the resin insulating layer 3*b* or fills any.

As such, the clearance is created between the case 4 and the side surface around the perimeter of the base plate 3*c* and the adhesive 5 is exposed, so that the air bubbles 9 in the adhesive 5 are easily emitted. Furthermore, forming the tapered portion 4*a* on the case 4 and bonding the case 4 to the resin insulating layer 3*b* and the base plate 3*c* with the adhesive 5 can avoid the air bubbles 9 in the adhesive 5 from coming in contact with the resin insulating layer 3*b*. Thus, the insulating properties of the power semiconductor module 100 can be secured without a shortage of the creepage distance between the circuit pattern 3*a* and the base plate 3*c*.

According to Embodiment 2, the resin-insulated base plate 3 includes the circuit pattern 3*a*, the resin insulating layer 3*b*, and the base plate 3*c*, and the outer circumferential surface of the base plate 3 closer to the side on which the semiconductor element 1 is mounted is exposed without the resin insulating layer 3*b*. The semiconductor element 1 is mounted on the circuit pattern 3*a*. The case 4 enclosing the resin-insulated base plate 3 is bonded to the resin insulating layer 3*b* with the adhesive 5. The region enclosed by the case 4 and the resin-insulated base plate 3 is sealed with the sealing resin 8. The resin insulating layer 3*b*, the base plate 3*c*, and the case 4 are bonded together with the region enclosed by the resin insulating layer 3*b*, the base plate 3*c*, and the tapered portion 4*a* of the case 4 formed closer to the resin insulating layer 3*b* being filled with the adhesive 5 made of the material identical to that of the sealing resin 8. The air bubbles 9 in the adhesive 5 appear in the tapered portion 4*a* opposite to the resin insulating layer 3*b* without contact with the resin insulating layer 3*b*. Furthermore, the clearance is created between the case 4 and the side surface around the perimeter of the base plate 3*c* and the adhesive 5 is exposed, so that the air bubbles 9 in the adhesive 5 are easily emitted. Thus, the insulating properties of the power semiconductor module 100 with such a structure can be secured without a shortage of the creepage distance between the circuit pattern 3*a* and the base plate 3*c*.

Sometimes, stress and distortion occur at the end portions of the resin insulating layer 3*b* and the base plate 3*c*, and the resin insulating layer 3*b* is peeled off from the base plate 3*c* due to the influence of warpage under environmental conditions including high and low temperatures in the power semiconductor module 100. However, since the resin insulating layer 3*b* and the base plate 3*c* are bonded and fixed with the adhesive 5, peeling off the resin insulating layer 3*b* from the base plate 3*c* can be prevented. Thus, the insulating properties of the power semiconductor module 100 can be secured.

Embodiment 3

Figure 4:
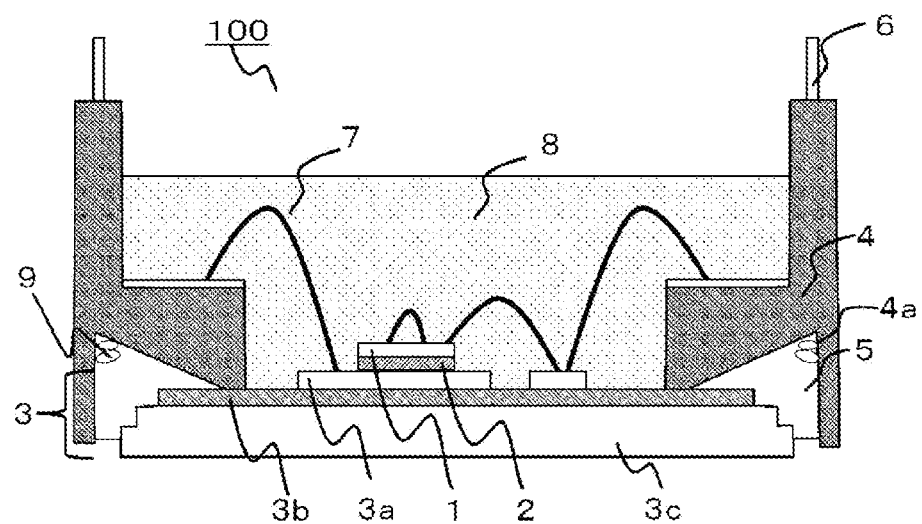
FIG. 4 is a cross-sectional view illustrating a structure of a power semiconductor module according to Embodiment 3.

FIG. 4 is a cross-sectional view illustrating a structure of a power semiconductor module according to Embodiment 3. The power semiconductor module 100 according to Embodiment 3 shares many components in common with that of Embodiment 1. Thus, differences with Embodiment 1 will be described, the same reference numerals are attached to the same or corresponding components, and the description thereof is omitted. As illustrated in FIG. 4, Embodiment 3 differs from Embodiment 1 in a structure where the outer circumferential surface of the base plate 3*c* is exposed, a bonding structure of the resin-insulated base plate 3 and the case 4, and the shape of the base plate 3*c*.

As illustrated in FIG. 4, the outer circumferential surface of the base plate 3*c* closer to the side on which the semiconductor element 1 is mounted is exposed without the resin insulating layer 3*b*. The resin insulating layer 3*b* is long enough to satisfy the creepage distance between the circuit pattern 3*a* and the base plate 3*c*.

The tapered portion 4*a* is formed on the case 4 closer to the resin-insulated base plate 3. The base plate 3*c*, the resin insulating layer 3*b*, and the case 4 are bonded together with a region enclosed by the resin insulating layer 3*b*, the base plate 3*c*, and the case 4 being filled with the adhesive 5.

The clearance is created between the case 4 and the side surface around the perimeter of the base plate 3*c* and the adhesive 5 is exposed, so that the air bubbles 9 in the adhesive 5 are easily emitted from the adhesive 5 during the adhesion or when the adhesive 5 is thermally cured. The adhesive 5 never seeps toward the surface of the base plate 3*c* opposite to the resin insulating layer 3*b* or fills any.

The adhesive 5 has the property of a lower adherence with the base plate 3*c* than those of the resin insulating layer 3*b* and the case 4. As illustrated in FIG. 4, forming steps at both ends of the base plate 3*c* closer to the side on which the semiconductor element 1 is mounted can improve the adhesion strength between base plate 3*c* and the adhesive 5 with the anchor effect.

As such, the clearance is created between the case 4 and the side surface around the perimeter of the base plate 3*c* and the adhesive 5 is exposed, so that the air bubbles 9 in the adhesive 5 are easily emitted. Furthermore, forming the tapered portion 4*a* on the case 4 and bonding the case 4 to the resin insulating layer 3*b* and the base plate 3*c* with the adhesive 5 can avoid the air bubbles 9 in the adhesive 5 from coming in contact with the resin insulating layer 3*b*. Thus, the insulating properties of the power semiconductor module 100 can be secured without a shortage of the creepage distance between the circuit pattern 3*a* and the base plate 3*c*.

According to Embodiment 3, the resin-insulated base plate 3 includes the circuit pattern 3*a*, the resin insulating layer 3*b*, and the base plate 3*c*, and the outer circumferential surface of the base plate 3*c* closer to the side on which the semiconductor element 1 is mounted is exposed without the resin insulating layer 3*b*. Furthermore, steps are formed at both ends of the base plate 3*c* closer to the side on which the semiconductor element 1 is mounted. The semiconductor element 1 is mounted on the circuit pattern 3*a*. The case 4 enclosing the resin-insulated base plate 3 is bonded to the resin insulating layer 3*b* with the adhesive 5. The region enclosed by the case 4 and the resin-insulated base plate 3 is sealed with the sealing resin 8. The resin insulating layer 3*b*, the base plate 3*c*, and the case 4 are bonded together with the region enclosed by the resin insulating layer 3*b*, the base plate 3*c*, and the tapered portion 4*a* of the case 4 formed closer to the resin insulating layer 3*b* being filled with the adhesive 5 made of the material identical to that of the sealing resin 8. The air bubbles 9 in the adhesive 5 appear in the tapered portion 4*a* opposite to the resin insulating layer 3*b* without contact with the resin insulating layer 3*b*. Furthermore, the clearance is created between the case 4 and the side surface around the perimeter of the base plate 3*c* and the adhesive 5 is exposed, so that the air bubbles 9 in the adhesive 5 are easily emitted. Thus, the insulating properties of the power semiconductor module 100 with such a structure can be secured without a shortage of the creepage distance between the circuit pattern 3*a* and the base plate 3*c*.

Sometimes, stress and distortion occur at the end portions of the resin insulating layer 3*b* and the base plate 3*c*, and the resin insulating layer 3*b* is peeled off from the base plate 3*c* due to the influence of warpage under environmental conditions including high and low temperatures in the power semiconductor module 100. However, since the resin insulating layer 3b and the base plate 3c are bonded and fixed with the adhesive 5, peeling off the resin insulating layer 3b from the base plate 3c can be prevented. Thus, the insulating properties of the power semiconductor module 100 can be secured.

Furthermore, the adhesive 5 has the property of a lower adherence with the base plate 3c than those of the resin insulating layer 3b and the case 4. Even in such a case, forming steps at both ends of the surface of the base plate 3c as illustrated in FIG. 4 can improve the adhesion strength between base plate 3c and the adhesive 5 with the anchor effect.

Embodiments herein can be freely combined, and appropriately modified or omitted.

While the invention has been shown and described in detail, the foregoing description is in all aspects illustrative and not restrictive. It is therefore understood that numerous modifications and variations can be devised without departing from the scope of the invention.

The invention claimed is:

1. A power semiconductor module, comprising:
   a semiconductor element;
   a resin-insulated base plate on which the semiconductor element is mounted including a resin insulating layer on one side of the resin-insulated base plate, a circuit pattern, and a base plate;
   a case enclosing the resin-insulated base plate;
   a sealing resin with which a region enclosed by the resin-insulated base plate and the case is sealed; and
   an adhesive with which the resin-insulated base plate is bonded to the case, the adhesive filling a tapered portion formed in the case and enclosed by the resin insulating layer of the resin-insulated base plate, wherein
   contact between the case and the resin insulating layer of the resin-insulated base plate maintains a creepage distance between the circuit pattern and the base plate.

2. The power semiconductor module according to claim 1, wherein the adhesive is made of a material identical to a material of the sealing resin.

3. The power semiconductor module according to claim 1, wherein the adhesive is exposed between the case and a side surface around a perimeter of the resin-insulated base plate.

4. The power semiconductor module according to claim 1, wherein an outer circumferential surface of the base plate closer to a side on which the semiconductor element is mounted is exposed.

5. The power semiconductor module according to claim 1, wherein steps are formed on a side surface of the base plate closer to a side on which the semiconductor element is mounted.

* * * * *